(12) United States Patent
Winarski et al.

(10) Patent No.: US 8,316,259 B2
(45) Date of Patent: *Nov. 20, 2012

(54) CONVOLUTION-ENCODED DATA STORAGE ON A REDUNDANT ARRAY OF INDEPENDENT DEVICES

(75) Inventors: Daniel James Winarski, Tucson, AZ (US); Craig A. Klein, Tucson, AZ (US); Nils Haustein, Zornheim (DE)

(73) Assignee: International Business Machines Corporation, Armonk, NY (US)

( * ) Notice: Subject to any disclaimer, the term of this patent is extended or adjusted under 35 U.S.C. 154(b) by 1134 days.

This patent is subject to a terminal disclaimer.

(21) Appl. No.: 12/173,732

(22) Filed: Jul. 15, 2008

(65) Prior Publication Data

US 2008/0270843 A1   Oct. 30, 2008

Related U.S. Application Data

(63) Continuation of application No. 11/124,647, filed on May 9, 2005, now Pat. No. 7,401,253.

(51) Int. Cl.
*G06F 11/10* (2006.01)
(52) U.S. Cl. .............. 714/6.24; 714/770; 714/786
(58) Field of Classification Search .............. 714/8, 770, 714/786, 6.24
See application file for complete search history.

(56) References Cited

U.S. PATENT DOCUMENTS

| | | | | |
|---|---|---|---|---|
| 3,868,632 A * | 2/1975 | Hong et al. | | 714/755 |
| 4,761,785 A * | 8/1988 | Clark et al. | | 714/805 |
| 5,271,012 A * | 12/1993 | Blaum et al. | | 714/6.24 |
| 5,315,602 A * | 5/1994 | Noya et al. | | 714/766 |
| 5,351,246 A * | 9/1994 | Blaum et al. | | 714/6.21 |
| 5,453,998 A * | 9/1995 | Dang | | 714/805 |
| 5,596,709 A * | 1/1997 | Bond et al. | | 714/6.32 |
| 6,219,800 B1 * | 4/2001 | Johnson et al. | | 714/5.1 |
| 6,516,443 B1 * | 2/2003 | Zook | | 714/792 |
| 7,370,261 B2 * | 5/2008 | Winarski et al. | | 714/770 |
| 7,401,253 B2 * | 7/2008 | Winarski et al. | | 714/6.13 |

OTHER PUBLICATIONS

"General Information on RAID", Intelligent Computer Peripherals, ICP, (www.icp-vortex.com/english/support/level_e.htm), date unknown.I.*
"RAID Level 6", (www.pcguide.com/ref/hdd/perf/raid/levels/singleLevel6-c.html), date unknown.*
Kagel, "RAID5 Versus RAID10 (or even RAID3 or RAID4)", date unknown.*
"Storing Data on Disk" (www.cse.iitk.ac.in/~hk/sc315/slides/StoringDataOnDisk.pdf), date unknown.*
Gray et al., "Parity Striping of Disk Arrays: Low-Cost Reliable Storage with Acceptable Throughput", 16th Int'l. Conf. on Very Large Databases, pp. 148-161, 1990.*

* cited by examiner

*Primary Examiner* — Stephen M Baker
(74) *Attorney, Agent, or Firm* — Dale F. Regelman; Quarles & Brady LLP

(57) ABSTRACT

A method, system and article of manufacture for the storing convolution-encoded data on a redundant array of independent storage devices (RAID) is described. The convolution-encoded data comprises error correction coded data to eliminate the need for parity as used in conventional RAID data storage. The number of storage devices may vary to accommodate expansion of storage capacity and provide on demand storage.

27 Claims, 17 Drawing Sheets

ENCODER STATE DIAGRAM FOR (2, 1, 3) CODE

| INITIAL STATE | DESTINATION STATE | INPUT INFORMATION | CODED DATA |
|---|---|---|---|
| $S_0$ | $S_0$ | 0 | 00 |
| $S_0$ | $S_1$ | 1 | 11 |
| $S_1$ | $S_2$ | 0 | 01 |
| $S_1$ | $S_3$ | 1 | 10 |
| $S_2$ | $S_4$ | 0 | 11 |
| $S_2$ | $S_5$ | 1 | 00 |
| $S_3$ | $S_6$ | 0 | 10 |
| $S_3$ | $S_7$ | 1 | 01 |
| $S_4$ | $S_0$ | 0 | 11 |
| $S_4$ | $S_1$ | 1 | 00 |
| $S_5$ | $S_2$ | 0 | 10 |
| $S_5$ | $S_3$ | 1 | 01 |
| $S_6$ | $S_4$ | 0 | 00 |
| $S_6$ | $S_5$ | 1 | 11 |
| $S_7$ | $S_6$ | 0 | 01 |
| $S_7$ | $S_7$ | 1 | 10 |

FIG. 3

A (2, 1, 3) BINARY CONVOLUTION ENCODER
2 OUTPUTS, 1 INPUT, AND 3 STAGES OF DELAY

500

| J | | | | | | | 1 | 0 | 1 | 1 | V(J,1) |
|---|---|---|---|---|---|---|---|---|---|---|---|
| 1 | 0 | 0 | 0 | 1 | 1 | 1 | 1 | | | | 1 |
| 2 | | 0 | 0 | 0 | 1 | 1 | 1 | 1 | | | 1 |
| 3 | | | 0 | 0 | 0 | 1 | 1 | 1 | 1 | | 0 |
| 4 | | | | 0 | 0 | 0 | 1 | 1 | 1 | 1 | 1 |
| 5 | | | | | 0 | 0 | 0 | 1 | 1 | 1 | 0 |
| 6 | | | | | | 0 | 0 | 0 | 1 | 1 | 0 |
| 7 | | | | | | | 0 | 0 | 0 | 1 | 1 |
| 8 | | | | | | | | 0 | 0 | 0 | 0 |
| 9 | | | | | | | | | 0 | 0 | 0 |
| 10 | | | | | | | | | | 0 | 0 |

501

| J | | | | | | | 1 | 1 | 1 | 1 | V(J,2) |
|---|---|---|---|---|---|---|---|---|---|---|---|
| 1 | 0 | 0 | 0 | 1 | 1 | 1 | 1 | | | | 1 |
| 2 | | 0 | 0 | 0 | 1 | 1 | 1 | 1 | | | 0 |
| 3 | | | 0 | 0 | 0 | 1 | 1 | 1 | 1 | | 1 |
| 4 | | | | 0 | 0 | 0 | 1 | 1 | 1 | 1 | 0 |
| 5 | | | | | 0 | 0 | 0 | 1 | 1 | 1 | 1 |
| 6 | | | | | | 0 | 0 | 0 | 1 | 1 | 0 |
| 7 | | | | | | | 0 | 0 | 0 | 1 | 1 |
| 8 | | | | | | | | 0 | 0 | 0 | 0 |
| 9 | | | | | | | | | 0 | 0 | 0 |
| 10 | | | | | | | | | | 0 | 0 |

| J | V(J,1) | V(J,2) | V |
|---|---|---|---|
| 1 | 1 | | 1 |
| 1 | | 1 | 1 |
| 2 | 1 | | 1 |
| 2 | | 0 | 0 |
| 3 | 0 | | 0 |
| 3 | | 1 | 1 |
| 4 | 1 | | 1 |
| 4 | | 0 | 0 |
| 5 | 0 | | 0 |
| 5 | | 1 | 1 |
| 6 | 0 | | 0 |
| 6 | | 0 | 0 |
| 7 | 1 | | 1 |
| 7 | | 1 | 1 |
| 8 | 0 | | – |
| 8 | | 0 | – |
| 9 | 0 | | – |
| 9 | | 0 | – |
| 10 | 0 | | – |
| 10 | | 0 | – |

FIG. 6

| | BIT 7 | BIT 6 | BIT 5 | BIT 4 | BIT 3 | BIT 2 | BIT 1 | BIT 0 |
|---|---|---|---|---|---|---|---|---|
| BYTE 0 | OPERATION CODE (2Ah) — 604 | | | | | | | |
| BYTE 1 | LOGICAL UNIT NUMBER | | | DPO | FUA | RESERVED | | RelAdr |
| BYTE 2 | (MSB) LOGICAL BLOCK ADDRESS — 602 | | | | | | | |
| BYTE 3 | | | | | | | | |
| BYTE 4 | | | | | | | | |
| BYTE 5 | (LSB) | | | | | | | |
| BYTE 6 | RESERVED | | | | | | | |
| BYTE 7 | (MSB) TRANSFER LENGTH — 603 | | | | | | | |
| BYTE 8 | (LSB) | | | | | | | |
| BYTE 9 | CONTROL BYTE | | | | | | | |

WRITE (10) COMMAND

ENCODER STATE DIAGRAM FOR (3, 2, 1) CODE

590 →

| INITIAL STATE | DESTINATION STATE | INPUT INFORMATION | CODED DATA |
|---|---|---|---|
| $S_0$ | $S_0$ | 00 | 000 |
| $S_0$ | $S_1$ | 10 | 101 |
| $S_0$ | $S_2$ | 01 | 011 |
| $S_0$ | $S_3$ | 11 | 110 |
| $S_1$ | $S_0$ | 00 | 111 |
| $S_1$ | $S_1$ | 10 | 010 |
| $S_1$ | $S_2$ | 01 | 100 |
| $S_1$ | $S_3$ | 11 | 001 |
| $S_2$ | $S_0$ | 00 | 100 |
| $S_2$ | $S_1$ | 10 | 001 |
| $S_2$ | $S_2$ | 01 | 111 |
| $S_2$ | $S_3$ | 11 | 010 |
| $S_3$ | $S_0$ | 00 | 011 |
| $S_3$ | $S_1$ | 10 | 110 |
| $S_3$ | $S_2$ | 01 | 000 |
| $S_3$ | $S_3$ | 11 | 101 |

*FIG. 14*

A (3, 2, 1) BINARY CONVOLUTION ENCODER
3 OUTPUTS, 2 INPUTS, AND 1 STAGE OF DELAY

CONVOLUTION-ENCODED DATA STORAGE ON A REDUNDANT ARRAY OF INDEPENDENT DEVICES

CROSS-REFERENCE TO RELATED APPLICATIONS

This application is a Continuation Application claiming priority from the Application having Ser. No. 11/124,647, filed May 9, 2005 now U.S. Pat. No. 7,401,253.

TECHNICAL HELD

The disclosure herein relates to data storage.

SUMMARY OF THE INVENTION

A method, system and article of manufacture for a system for storing convolution-encoded data on a redundant array of independent storage devices (RAID) are described. In system form, embodiments comprise a convolution encoder adapted to process information received from an information source. The convolution encoder operates by convolving present and past bits of the information to produce error correction coded data. A distributor is adapted to distribute the coded data to a plurality of storage devices such that one or more of the plurality of storage devices may fail while permitting the information to be reconstructed from the coded data stored on non-failing storage devices.

In certain embodiments the error correction coded data comprises one or more words, each word comprising n bits, where n is greater than zero, each word is produced from the convolution encoder in response to the convolution encoder processing a portion of the information received by the convolution encoder. In certain embodiments the distributor is adapted to distribute the n bits of each word to the plurality of storage devices such that none of the plurality of storage devices receives more than one of the n bits of each word. In other embodiments the distributor is adapted to distribute each word to the plurality of storage devices such that none of the plurality of storage devices receives two or more consecutive words. In certain embodiments the total number of storage devices is an integer multiple of the n bits.

In certain embodiments the system further comprises a metadata controller adapted to process the information to produce metadata associated with the coded data. The metadata comprises storage location information specifying a storage location for the coded data and/or encoder information specifying the type of encoding for the coded data. In certain embodiments the metadata controller is further adapted to store the metadata on one or more of the plurality of storage devices and/or on non-volatile memory.

BRIEF DESCRIPTION OF THE DRAWINGS

FIG. 3 illustrates the encoder state diagram for a (2,1,3) error correction code of FIG. 2 in table form.

FIG. 5 illustrates the discrete convolution encoding of sample information for each individual output shown in FIG. 4.

FIG. 6 illustrates the interweaving of each individual output shown in FIG. 4 into the error correction coded data shown in FIGS. 2 and 3.

FIG. 7 illustrates an exemplary SCSI write command.

FIG. 14 illustrates FIG. 13 in table form.

DETAILED DESCRIPTION OF THE PREFERRED EMBODIMENTS

Figure 1:
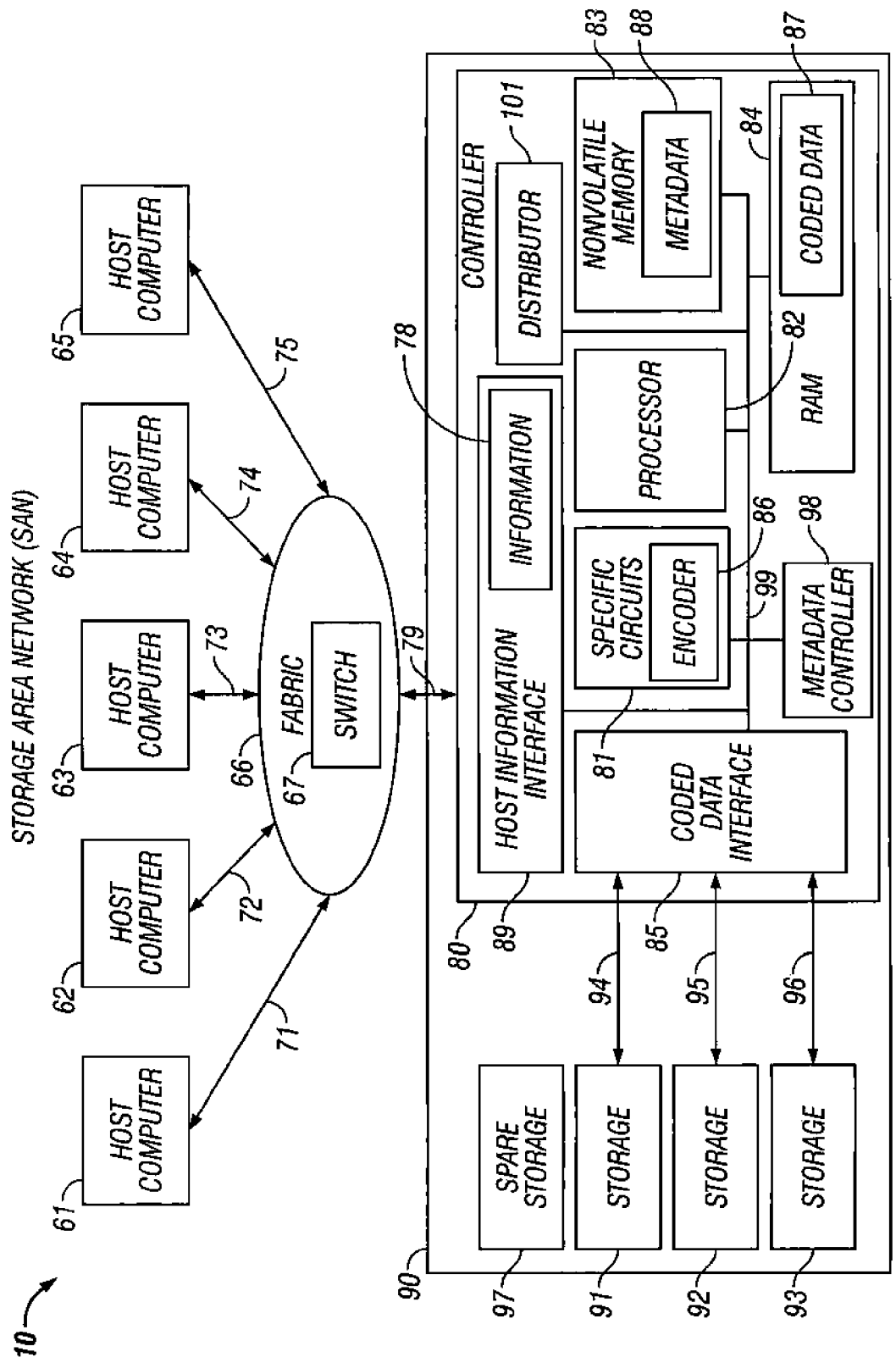
FIG. 1 is a block diagram illustrating aspects of an exemplary storage area network (SAN).

Referring to figures, wherein like parts are designated with the same reference numerals and symbols, FIG. 1 is a block diagram that illustrates aspects of an exemplary storage area network (SAN) 10. SAN 10 is typically designed to operate as a switched-access-network, wherein switches 67 are used to create a switching fabric 66. In certain embodiments SAN 10 is implemented using the Small Computer Systems Interface (SCSI) protocol running over a Fibre Channel ("FC") physical layer. In other embodiments, SAN 10 may be implemented utilizing other protocols, such as Infiniband, FICON (a specialized form of FIbre Channel CONnectivity), TCP/IP, Ethernet, Gigabit Ethernet, or iSCSI. The switches 67 have the addresses of both the hosts 61, 62, 63, 64, 65 and controller 80 so that any of hosts 61-65 can be interchangeably connected to any controller 80.

Host computers 61, 62, 63, 64, 65 are coupled to fabric 66 utilizing I/O interfaces 71, 72, 73, 74, 75 respectively. I/O interfaces 71-75 may be any type of I/O interface; for example, a FC loop, a direct attachment to fabric 66 or one or more signal lines used by host computers 61-65 to transfer information respectfully to and from fabric 66. Fabric 66 includes, for example, one or more FC switches 67 used to connect two or more computer networks. In certain embodiments, FC switch 67 is a conventional router switch.

Switch 67 interconnects host computers 61-65 to controller 80 across I/O interface 79. I/O interface 79 may be any type of I/O interface, for example, a Fibre Channel, Infiniband, Gigabit Ethernet, Ethernet, TCP/IP, iSCSI, SCSI I/O interface or one or more signal lines used by FC switch 67 to transfer information respectively to and from controller 80 and subsequently to a plurality of storage devices 91-93. In the example shown in FIG. 1, storage devices 91-93 and controller 80 are operated within RAID 90. RAID 90 may also include spare storage 97 that may be exchanged with storage devices 91-93 in case of the failure of any of storage devices 91-93. Additional storage in excess of storage devices 91-93 could be included in RAID 90. Alternately, storage 91-93 could be physically remote from each other as well as controller 80, so that a single disaster could jeopardize only one of storage devices 91-93.

RAID 90 typically comprises one or more controllers 80 to direct the operation of the RAID. Controller 80 may take many different forms and may include an embedded system, a distributed control system, a personal computer, workstation, etc. FIG. 1 shows a typical RAID controller 80 with processor 82, metadata controller 98, random access memory (RAM) 84, nonvolatile memory 83, specific circuits 81, coded data interface 85 and host information interface 89. Processor 82, RAM 84, nonvolatile memory 83, specific circuits 81, metadata controller 98, coded data interface 85 and host information interface 89 communicate with each other across bus 99.

Alternatively, RAM 84 and/or nonvolatile memory 83 may reside in processor 82 along with specific circuits 81, coded data interface 85, metadata controller 98, and host information interface 89. Processor 82 may include an off-the-shelf microprocessor, custom processor, FPGA, ASIC, or other form of discrete logic. RAM 84 is typically used as a cache for data written by hosts 61-65 or read for hosts 61-65, to hold calculated data, stack data, executable instructions, etc. In addition RAM 84 is typically used for the temporary storage of coded data 87 from encoder 86 before that data is stored on storage devices 91-93.

Nonvolatile memory 83 may comprise any type of nonvolatile memory such as Electrically Erasable Programmable Read Only Memory (EEPROM), flash Programmable Read Only Memory (PROM), battery backup RAM, hard disk drive, or other similar device. Nonvolatile memory 83 is typically used to hold the executable firmware and any nonvolatile data, such as metadata 88. Details of metadata 88 are further discussed below with reference to FIG. 8.

In certain embodiments, coded data interface 85 comprises one or more communication interfaces that allow processor 82 to communicate with storage devices 91-93. Host information interface 89 allows processor 82 to communicate with fabric 66, switch 67 and hosts 61-65. Examples of coded data interface 85 and host information interface 89 include serial interfaces such as RS-232, USB (Universal Serial Bus), SCSI (Small Computer Systems Interface), Fibre Channel, Gigabit Ethernet, etc. In addition, coded data interface 85 and/or host information interface 89 may comprise a wireless interface such as radio frequency ("RF") (i.e. Bluetooth) or an optical communications device such as Infrared (IR).

In certain embodiments, metadata controller 98 is implemented in processor 82 by software, firmware, dedicated logic or combinations thereof. In addition, all or part of metadata controller 98 may reside outside controller 80, such as in a software implementation in one of hosts 61-65. Metadata controller 98, manages metadata associated with information received for storage as coded data on storage devices. In certain embodiments, metadata controller 98 is responsible for generating, changing, maintaining, storing, retrieving and processing metadata (i.e. metadata 88) associated with information received for storage as coded data.

In certain embodiments, distributor 101 is implemented in processor 82 by software, firmware, dedicated logic or combinations thereof. In addition, all or part of distributor 101 may reside outside controller 80, such as in a software implementation in one of hosts 61-65. Distributor 101 distributes coded data (i.e. coded data 87) to RAM, and/or directly to storage devices in a format (described below) such that the coded data and/or the source information may be decoded and/or reconstructed from non-failing storage devices in the case where one or more storage devices have failed. When distributor 101 distributes the data to the storage devices, such as devices 91-93, the distribution is done in accordance with metadata 88, so that the distributed data can be later read from the storage devices.

Specific circuits 81 provide additional hardware to enable controller 80 to perform unique functions, such as fan control for the environmental cooling of storage devices 91-93, controller 80 and encoder 86. Encoder 86 may be implemented as a convolution encoder (i.e. convolution encoder 220 of FIG. 4, convolution encoder 420 of FIG. 15). Specific circuits 81 may comprise electronics that provide Pulse Width Modulation (PWM) control, Analog to Digital Conversion (ADC), Digital to Analog Conversion (DAC), exclusive OR (XOR), etc. In addition, all or part of specific circuits 81 may reside outside controller 80, such as in a software implementation in one of hosts 61-65.

Figure 2:
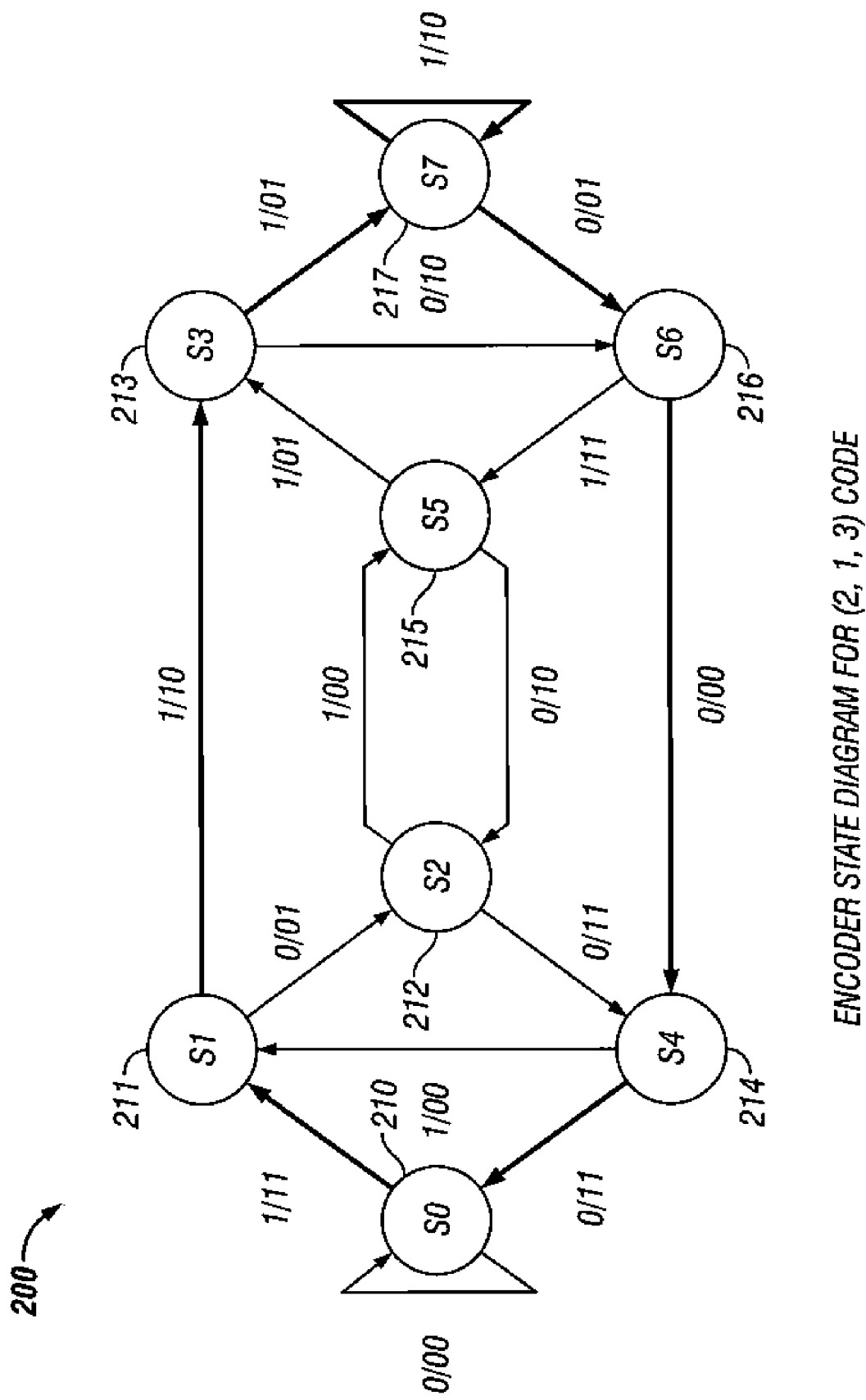
FIG. 2 illustrates an encoder state diagram for a (2,1,3) error correction code.

In certain embodiments, encoder 86 may be implemented as a convolution encoder. The operation of a convolution encoder may be understood by a state diagram. State diagram 200 for (2,1,3) binary convolution encoding is shown in FIG. 2. State diagram 200 comprises eight states: $S_0$ 210, $S_1$ 211, $S_2$ 212, $S_3$ 213, $S_4$ 214, $S_5$ 215, $S_6$ 216 and $S_7$ 217. Discrete transitions between states, in state diagram 200, are limited in number and direction. For example, the encoding process starting at state $S_0$ 210 can only transition back to $S_0$ 210 or forward to $S_1$ 211. Similarly the process from $S_1$ 211 can only transition to $S_2$ 212 or $S_3$ 213, etc. Each transition between states in state diagram 200 results in the encoding of one bit of information into two bits of error correction coded data. This encoding is further explained with reference to table 290 in FIG. 3.

Table 290 in FIG. 3 has four columns: initial state 291, destination state 292, information 293 and error correction coded data 294. There are a total of sixteen rows in table 290, based on a total of eight states in state diagram 200 and two possible transitions from one specific state to the next immediately-possible states. Table 290 was generated via state diagram 200 and is used herein to illustrate the encoding of information to produce coded data.

FIG. 2, highlighted encoding path comprising: $S_0$ 210, $S_1$ 311, $S_3$ 213, $S_7$ 217, $S_7$ 217, $S_6$ 216, $S_4$ 214 and $S_0$ 210 is shown for the example encoding of input information 1111000. $S_0$ 210 to $S_1$ 211 encodes 1 into 11. $S_1$ 211 to $S_3$ 213 encodes 1 into 10. $S_3$ 213 to $S_7$ 217 encodes 1 into 01. $S_7$ 217 to $S_7$ 217 encodes 1 into 10. $S_7$ 217 to $S_6$ 216 encodes 0 into 01. $S_6$ 216 to $S_4$ 214 encodes 0 in 00. Finally, $S_4$ 214 to $S_0$ 210 encodes 0 into 11. The result of this is that input information (i.e. host information from host(s) 61-65) 1111000 is encoded into error correction coded data 11100110010011 for storage in RAID 90.

Figure 4:
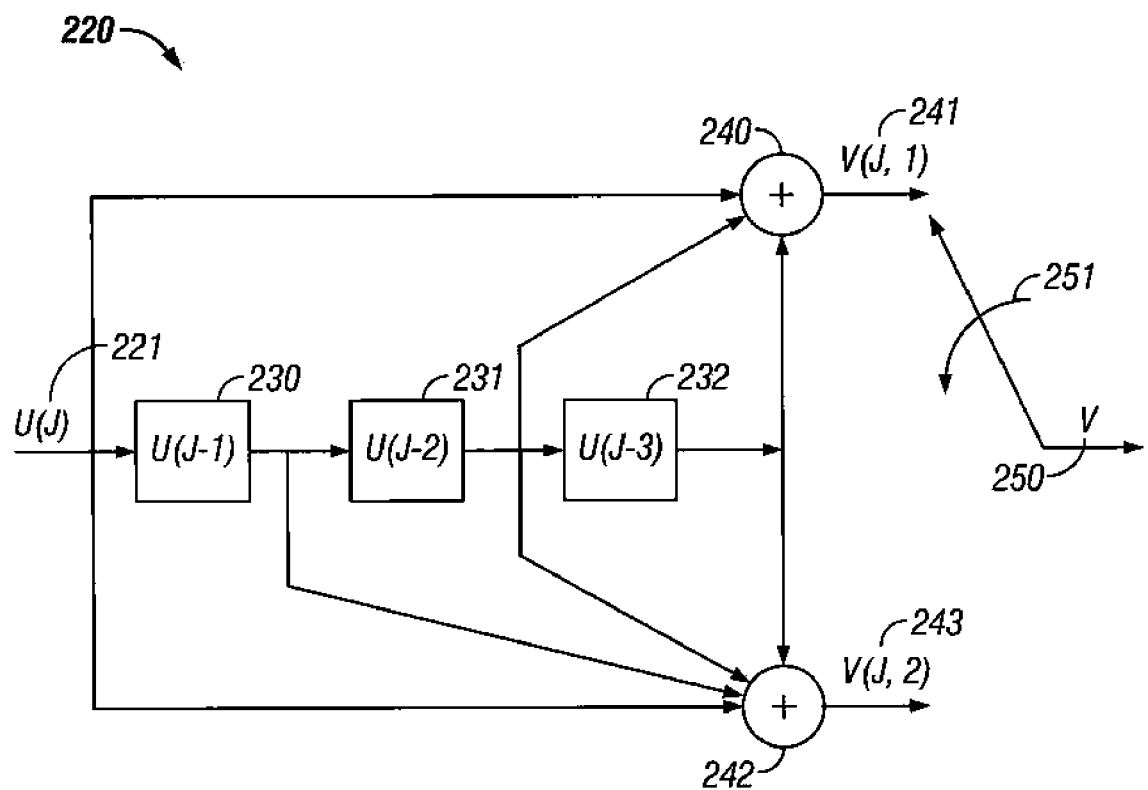
FIG. 4 illustrates a (2,1,3) binary convolution encoder circuit with two outputs, one input and three stages of delay elements.

In FIG. 4, encoder circuit 220 is shown for the binary (2,1,3) code of state diagram 200 of FIG. 2 and table 290 of FIG. 3. Encoder circuit 220 is one implementation of encoder 86 in specific circuits 81 of controller 80. Alternatively, encoder 220 may be implemented external to controller 80. Encoder circuit 220 receives input data stream U(J) 221 one bit at a time, for encoding. Encoder circuit 220 comprises an m=3-stage shift register, comprising registers 230, 231, and 232. The initial contents of registers 230-232 are preferably zero for the encoding process. The input information stream U(J) 221 and the outputs of registers 230, 231, and 232 are selectively added by n=2 modulo-2 adders (resulting in no carryover for binary addition), comprising adder 240 to produce output V(J,1) 241 and adder 242 to produce output V(J,2) 243. Multiplexer 251 serializes the individual encoder outputs V(J,1) 241 and V(J,2) 243 into encoded output V 250. The modulo-2 adders may be implemented as XOR (exclusive or) gates in specific circuits 81 or alternatively by use of software, firmware, dedicated logic, etc. Because modulo-2 binary addition is a linear operation, the encoder may operate as a linear feedforward shift register. Each incremental output of V 250 for an index of J, as defined by V(J,1) and V(J,2) in FIG. 4, is referred to as a word.

FIGS. 2-6 illustrate discrete convolution between an encoder and an input information stream. This discrete convolution is illustrated in its simplest form of numerical detail in FIGS. 5-6. Table 500 (FIG. 5) shows the discrete convolution between example input information 1111000 and the encoder which produces output V(J,1). Similarly, Table 501 (FIG. 5) shows the discrete convolution between example input information 1111000 and the encoder which produces output V(J,2).

For Table 500, the encoder to produce V(J,1) is represented by the digital string 1011 (top column, right side of table 500), because in FIG. 4 there is a connection (signified by the first 1 in 1011) between U(J) 221 and V(J,1) 241, there is not a connection (signified by the 0 in 1011) between U(J-1) 230 and V(J,1) 241, and there are connections (signified by the rightmost 1's in 1011) between U(J-2) 231 and V(J,1) 241 as well as U(J-3) 232 and V(J,1) 241. For Table 501, the encoder is represented by the digital string 1111, because in FIG. 4 there is a connection (signified by the first 1 in 1111) between U(J) 221 and V(J,2) 243, there is a connection (signified by the second 1 in 1111) between U(J-1) 230 and V(J,2) 243, and there are connections (signified by the rightmost 1's in 1111) between U(J-2) 231 and V(J,2) 243 as well as U(J-3) 232 and V(J,2) 243.

An example of processing information by convolving present and past bits of the information to produce error correction coded data is described with reference to Tables 500 and 501 (FIG. 5). Discrete convolution is implemented by first constructing the mirror image (with respect to time) of the input information stream 1111000, where time runs from left to right. Thus, mirror image 0001111 is shown in rows 1 through 10 in both Tables 500 and 501. Mirror image 0001111 is shifted to the right in each succeeding row of Tables 500 and 501 to illustrate the operation of convolution as mirror image 0001111 is shifted one bit at a time. Then, whatever digits of 0001111 are shown below either encoder 1011 or encoder 1111 are multiplied bitwise by the respective digits of that encoder. The results of this bitwise encoding are then summed by modulo-2 addition, to achieve the encoded results shown in the rightmost column of Table 500 for V(J,1) and the rightmost column of Table 501 for V(J,2).

The output of FIG. 4 is obtained by the multiplexing of V(J,1) 241 and V(J,2) 243 to produce output error correction coded data stream V 250. The multiplexing of V(J,1) 241 and V(J,2) 243 is illustrated in Table 502 of FIG. 6. In Table 502, V(J,1) and V(J,2) are staggered and then merged in the rightmost column into output stream V of 11100110010011000000. The trailing zeros of length 2*m, which is 2*3 or 6 for the case in FIG. 6, are truncated, to achieve the final example error correction coded data of 11100110010011. It is these trailing zeroes which re-initialize memories 230-232 to zero for the next input stream of information, so that as each portion of information is received by the encoder, the encoder may begin operation with memories 230-232 initialized to zero. Thus, FIGS. 5-6 illustrate the discrete convolution process which is implemented in FIGS. 2-4 and FIG. 4 is an example of circuitry for the implementation of this particular discrete convolution process.

Figure 9:
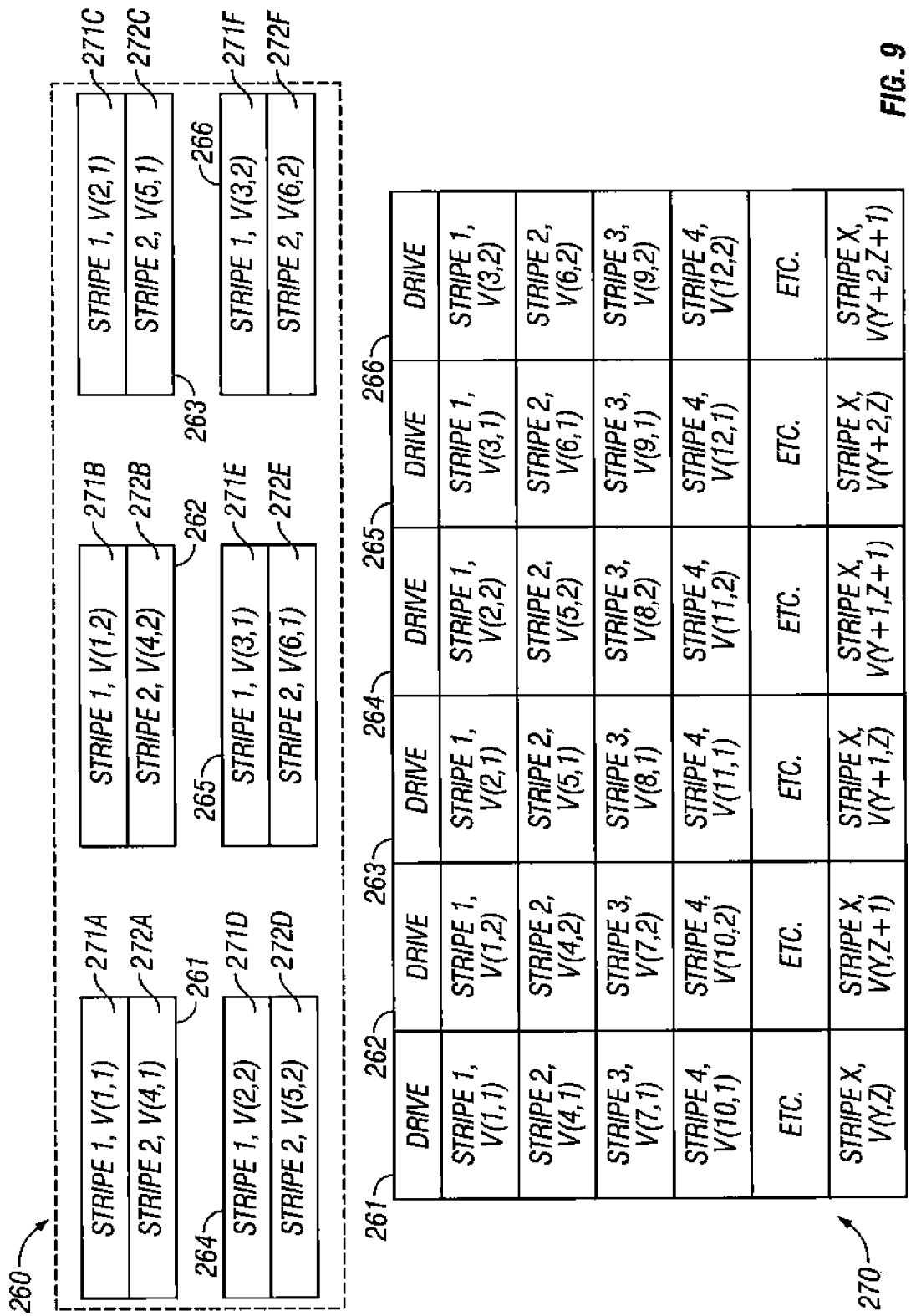
FIG. 9 illustrates a convolution RAID with 1-bit wide stripes for k=2 output encoders.
Figure 10:
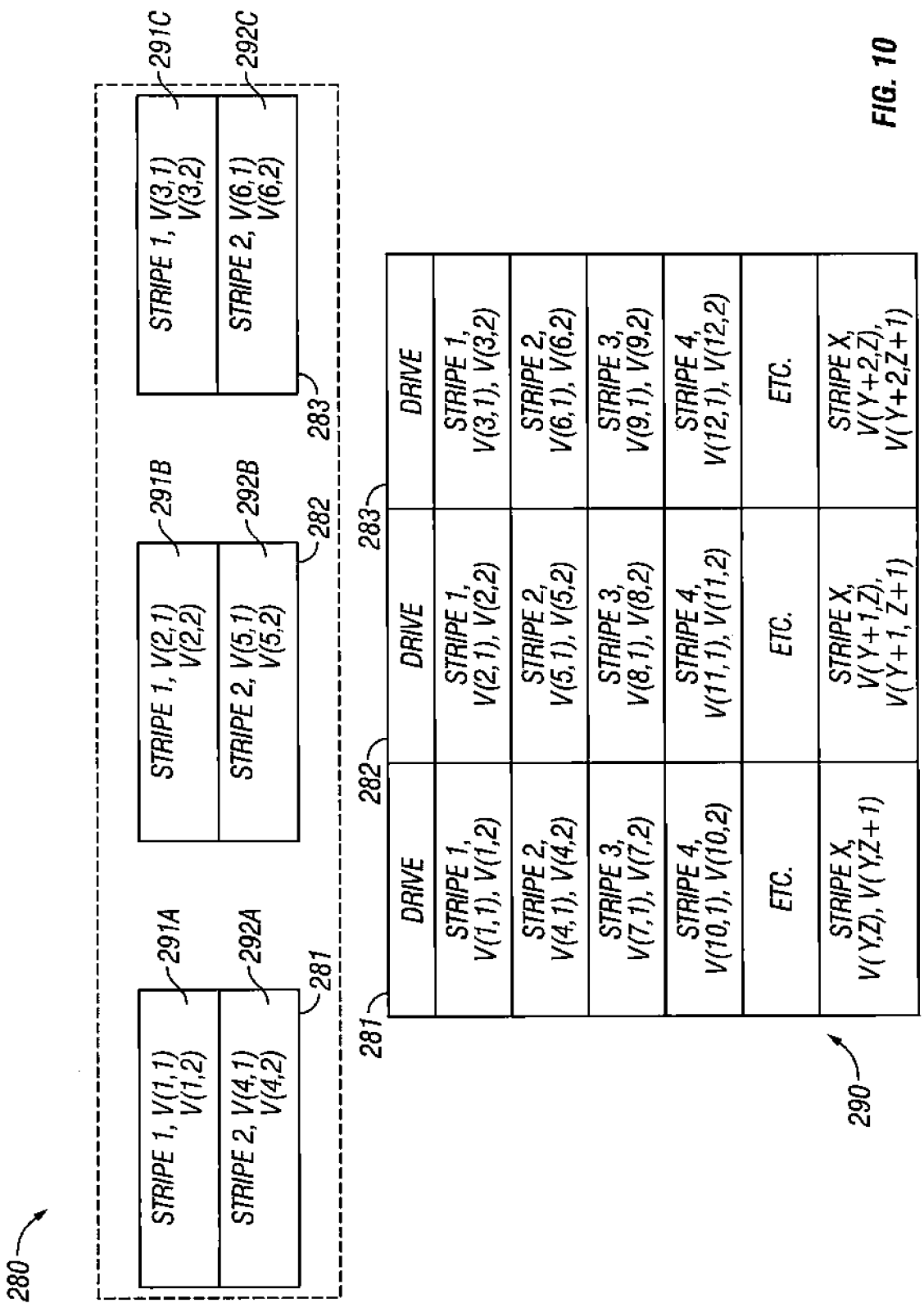
FIG. 10 illustrates a convolution RAID with k=2-bit wide stripes.

In certain embodiments, the error correction coded data (i.e. as shown in FIGS. 9-10) is stored in RAM 84 of controller 80 before being stored on storage devices 91-93. RAM 84 may be used to hold the error correction coded data from the output of an encoder (i.e. V 250 of FIG. 4, or output V 450 of FIG. 15) until the error correction coded data reaches a predetermined size and before it is stored on storage devices 91-93. A write command (i.e. exemplary write command 600 illustrated in FIG. 7) may then be used to store the error correction coded data from RAM 84 on the destination storage devices, such as storage devices 91-93 of FIG. 1. Write command 600 is an example of a SCSI write command, comprising a starting logical block address (LBA) 602, transfer length 603, and Logical Unit Number (LUN) 604. LUN 604 designates to which of storage devices 91-93 that write command 600 is directed. Starting LBA 602 indicates the first logical block address on the destination storage device to receive data, and transfer length 603 indicates how much data is transferred. Write command 600 maybe implemented across a SCSI or Fibre Channel interface. Write command 600 is only one possible write command which could be used. Other SCSI write commands include write plus verify, for example, where the written data is verified before the write command successfully concludes.

Figure 8:
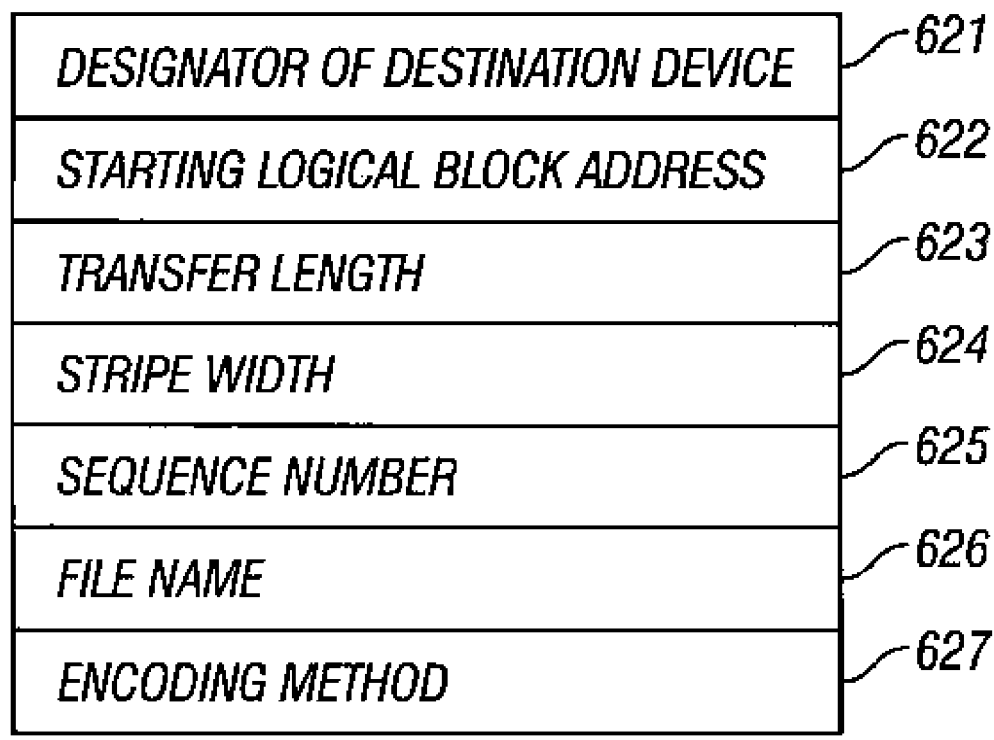
FIG. 8 illustrates a metadata structure.

In certain embodiments, controller 80 (i.e. via metadata controller 98) also generates metadata 88 before, during or after processing the input information and/or error correction coded data. One example of the internal structure of metadata 88 is shown in FIG. 8. One column of metadata 88 may be used for each storage device 91-93 upon which the error correction coded data 87 is stored on. In this implementation, metadata 88 comprises a map of where the error correction coded data is stored on storage 91-93 of RAID 90. Metadata 88 may for example, comprise the designator 621 of the storage 91-93, such as a persistent worldwide name, which is a unique name that may be assigned to each storage device (i.e. hard disk drive). Alternately, designator 621 could be a VOLSER (volume serial number) or other unique name for the particular storage device. Metadata 88 may also comprise the starting LBA 622 and transfer length 623, both of which are specified in the SCSI write command 600 used to store the error correction coded data on storage devices 91-93. Metadata 88 may also comprise the stripe width 624, which may be either 1 bit for FIGS. 9 and 16, or one word equal to the number "n" of output bits of the encoder 86 (n=2 bits for FIG. 10 and n=3 bits for FIG. 17). Metadata 88 may include a sequence number 625 and file name 626, so that the error correction coded data subsequently read from storage 91-93 can be reassembled in RAM 84 and decoded. Lastly, metadata 88 may include the encoding method used, the encoding method may be useful, for example, when the coded data is stored on removable media, such as a plurality of tape or optical disk cartridges. Metadata 88 may be stored in non-volatile memory 83 of controller 80 and/or on one or more of the destination storage devices 91-93. Metadata 88 may be used by controller 80 to retrieve the error correction coded data from the destination storage devices, reassemble the error correction coded data in RAM 84 and decode the data to produce the information that the error correction coded data was derived from for sending to hosts 61-65 or other information sources or receivers.

FIG. 9 shows the storage of encoded data in RAID 260, which comprises a plurality of storage devices 261-266. The encoded data shown in RAID 260 may be the result of a single portion of information encoded by encoder 220. Stripe 1 is the first stripe in RAID 260 and it is the first stripe of this single portion of error correction coded data. Stripe 1 comprises bit V(1,1) 271A in device 261, bit V(1,2) 271B in device 262, bit V(2,1) 271C in device 263, bit V(2,2) 271D in device 264, bit V(3,1) 271E in device 265, and bit V(3,2) 271F in device 266.

Stripe 2, is the second stripe in RAID 260 of this same single portion of error correction coded data and it comprises bit V(4,1) 272A in device 261, bit V(4,2) 272B in device 262, bit V(5,1) 272C in device 263, bit V(5,2) 272D in device 264, bit V(6,1) 272E in device 265, and bit V(6,2) 272F in device 266. In certain embodiments, RAID 260 has an integer multiple of n=2 storage devices (i.e. six storage devices).

FIG. 10 shows an alternative to the 1 bit per stripe per device shown in FIG. 9 for information encoded by encoder 220. In FIG. 10, because encoder 220 has n=2 outputs, then n=2 bits (called a "word") of output V are stored per device in an n=2 bit wide stripe. Two stripes are shown in FIG. 10 for RAID 280, which comprises devices 281-283, for the same portion of error correction coded data shown in FIG. 9. Stripe 1, is the first stripe in RAID 280 and it comprises bits V(1,1) and V(1,2) 291A in device 281, bits V(2,1) and V(2,2) 291B in device 282, and bits V(3,1) and V(3,2) 291C in device 283. Similarly, stripe 2, is the second stripe in RAID 280 and it comprises bits V(4,1) and V(4,2) 292A in device 281, bits V(5,1) and V(5,2) 292B in device 282, and bits V(6,1) and V(6,2) 292C in device 283. Thus, the same portion of error correction coded data may be stored either one bit per stripe (FIG. 9) or one word for stripe (FIG. 10).

RAID expansion is accommodated easily with convolution error correction coded data, because the stripes for a given portion of error correction coded data are all logically connected and there is no parity which is unique to a particular stripe. For example, RAID 280 of FIG. 10 may be expanded to RAID 260 of FIG. 9 by doubling the number of drives in the RAID and copying bits from the configuration shown in FIG. 10 into the configuration shown in FIG. 9. This RAID expansion adds free space to the RAID for further data addition and requires neither recalculation of parity as must be done for RAIDs 3, 4, 5, and 6, nor additional convolution encoding. Metadata 88 may need to be recalculated for all storage in the newly expanded RAID, because the starting LBAs and storage designators may have changed as a result of the RAID expansion.

Figure 11:
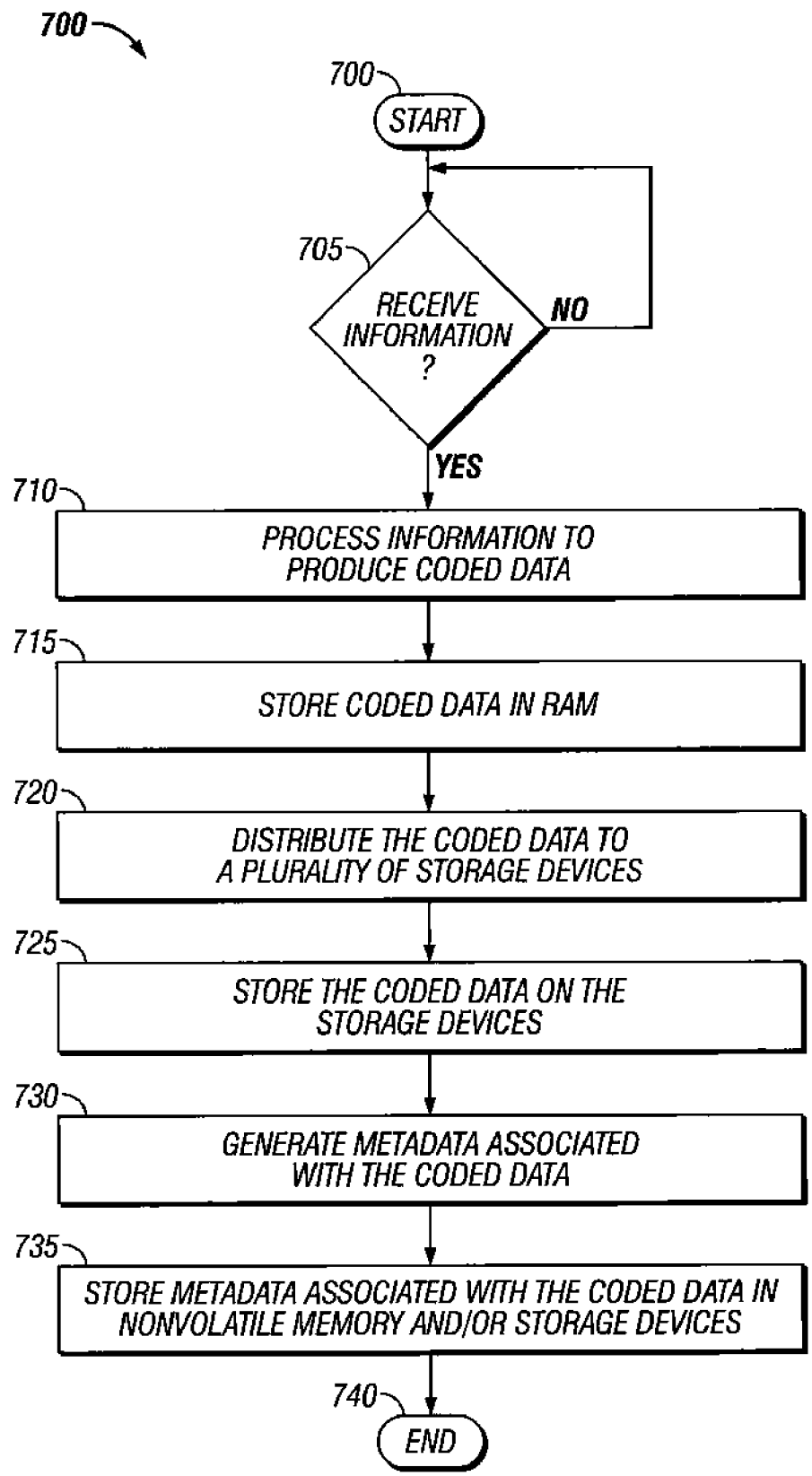
FIG. 11 illustrates a flowchart for the generation and subsequent distribution and storage of convolution encoded data across an array of storage devices.

Flowchart 700, shown in FIG. 11 outlines a process to implement one embodiment to store error correction coded data derived from information received from an information source. The process begins at step 701 and flows to decision step 705, to determine if controller 80 received information from a source (i.e. host computer(s) 61-65). The information received by controller 80 may be sent by a customer, a third party providing a service to a customer, a user or any other entity that has access to controller 80. If information is not received, the process cycles back to step 705. If information is received, the process flows to step 710 where a convolution encoder (i.e. encoder 86) processes the information by convolving present and past bits of the information to produce error correction coded data. Encoder 86 may be encoder 220 of FIG. 4, or encoder 420 of FIG. 15, or any other convolution encoder. In certain embodiments, information to be encoded and stored on storage devices 91-93 is received from an information source (i.e. host(s) 61-65) by controller 80. Host information interface 89 receives information 78 from one of hosts 61-65 and transfers information 78 to other components coupled to controller 80 (i.e. processor 82, specific circuits 81, etc.). Information 78 may be temporary stored in a memory device (i.e. RAM 84, nonvolatile memory 83, a dedicated processor memory, etc.) before, during or after processing by encoder 86 to produce error correction coded data 87.

From step 710, the process flows to step 715, where the error correction coded data is stored in RAM (i.e. RAM 84) in advance of distribution (i.e. by distributor 101) to the storage devices (i.e. storage 91-93, 97 of RAID 90). Alternatively, the error correction coded data may be stored in nonvolatile memory 83, another memory device, cache memory, etc. The error correction coded data is stored in RAM in a format for distribution to the storage devices.

From step 715, the process flows to step 720, where distributor (i.e. distributor 101 implemented in controller 80) distributes the coded data to a plurality of storage devices (i.e. storage 91-93, 97 of RAID 90) such that one or more of the plurality of storage devices may fail while permitting the information to be reconstructed from the coded data stored on non-failing storage devices. In one embodiment the error correction coded data output of encoder 86 is stored in RAM 84 in a format determined by a user selected stripe width (i.e. 1 bit or 1 word) and the number, D, of storage devices in RAID 90.

For one embodiment the error correction coded data comprises one or more words, each word comprising n bits, n is greater than zero and each word is produced from the convolution encoder in response to the convolution encoder processing a portion of the information. The portion of the information may, for example, comprise k bits, where k is greater than zero. The distributor is further adapted to distribute the n bits of each the word to the plurality of storage devices such that none of the plurality of storage devices receives more than one of the n bits of each the word. FIG. 9 shows an example of error correction coded data distributed to storage devices (260), when a (2,1,3) binary convolution encoder (FIG. 4) is used to process the information to produce error correction coded data. Each word of the error correction coded data may comprise, for example two bits (n=2) as shown in FIG. 9, the first word comprises V(1,1) and V(1,2), the second word comprises V(2,1) and V(2,2), the third word comprises V(3,1) and V(3,2), etc. For this example, none of the of storage devices receives more than one of the two bits of each the word.

FIG. 9 also shows a table (270) of an example of error correction coded data as stored in a memory device, for example RAM 84. Table 270 is organized into columns, where each column comprises error correction coded data that is stored in a respective storage device (i.e. storage devices 91-93). For example, the first column of table 270 shows the error correction coded data for storage on drive 261. The length of the column may vary and in one embodiment the columns are allowed to fill to a specified capacity with error correction coded data before the error correction coded data is distributed and written to the respective storage devices. The error correction coded data may be written to each respective drive by, for example, write command 600 (FIG. 7).

Figure 15:
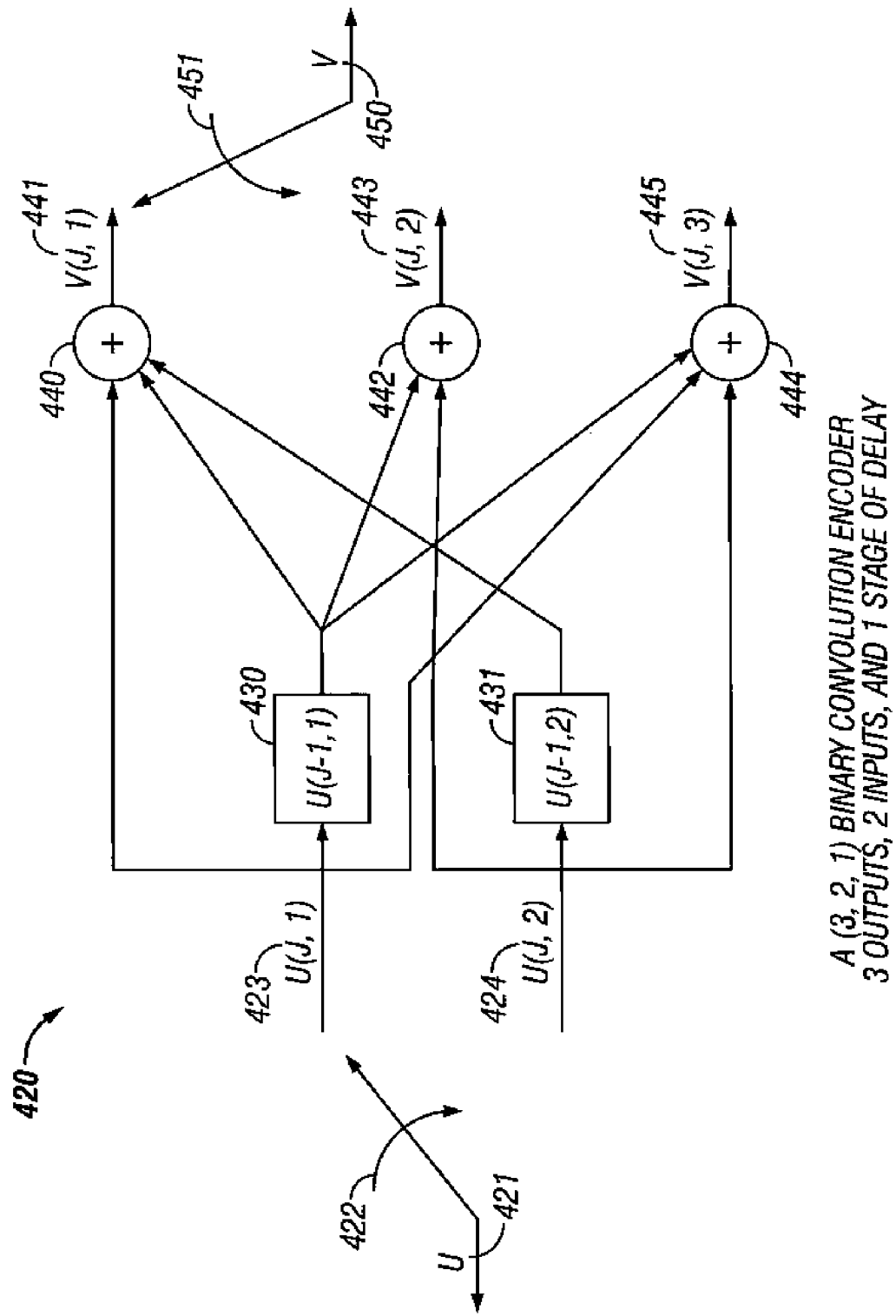
FIG. 15 illustrates a (3,2,1) binary convolution encoder circuit with three outputs, two inputs, and one stage of delay elements.
Figure 16:
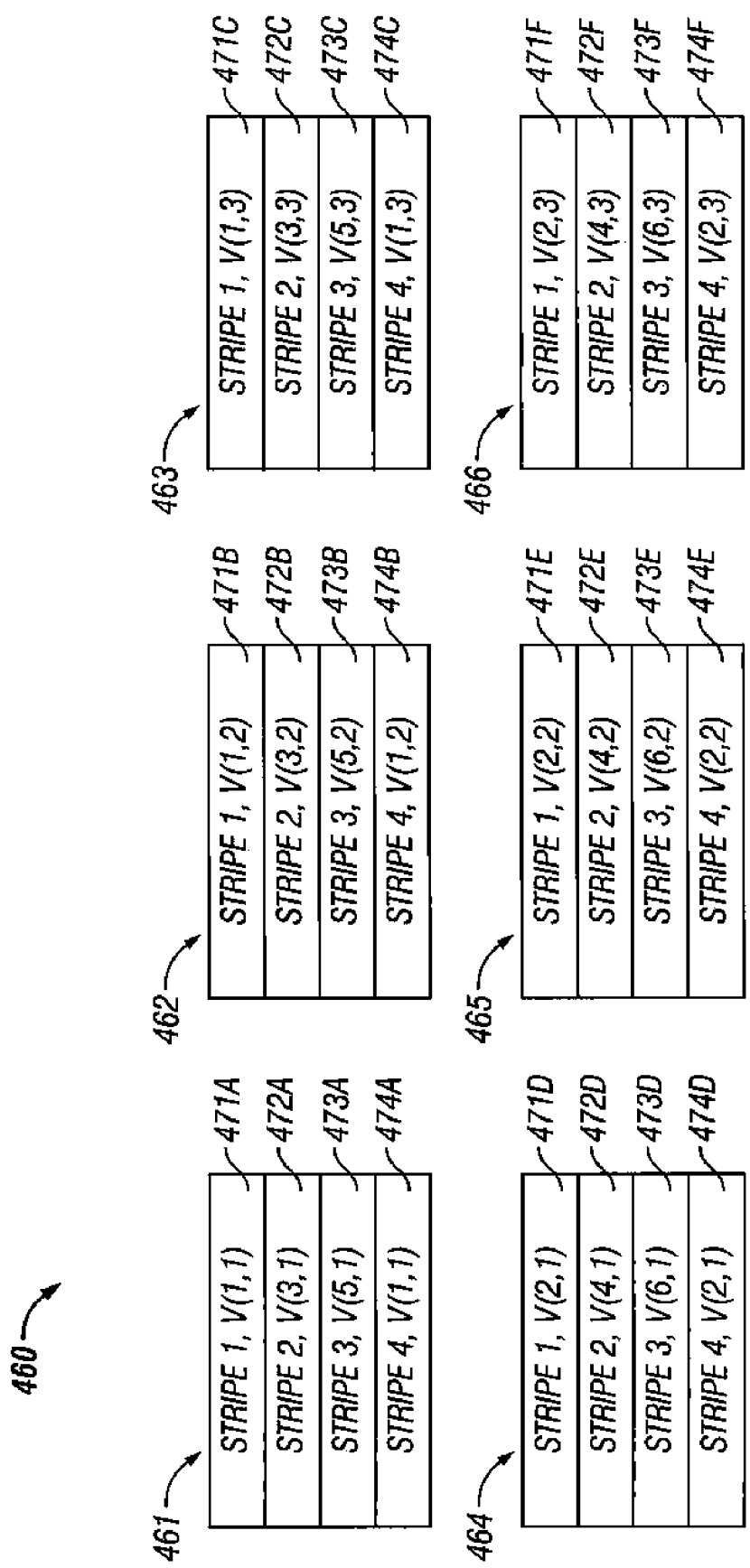
FIG. 16 illustrates a convolution RAID with 1-bit wide stripes for k=3 output encoders.

In another embodiment a (3,2,1) binary convolution encoder is used to process the information and produce error correction coded data. FIG. 16 shows an example of error correction coded data distributed to storage devices, when a (3,2,1) binary convolution encoder (FIG. 15) is used to process the information to produce error correction coded data. Each word of the error correction coded data may comprise, for example three bits (n=3) as shown in FIG. 16, the first word comprises V(1,1), V(1,2) and V(1,3), the second word comprises V(2,1), V(2,2) and V(2,3), the third word comprises V(3,1), V(3,2) and V(3,3), etc. For this example, none of the of storage devices receives more than one of the three bits of each the word. Larger word sizes may be accommodated by increasing the number of bits, n in each word and increasing the number of drives proportional to number of bits, n. In one embodiment, the total number of the plurality of storage devices is an integer multiple of the n bits. For the example shown in FIG. 16, six storage devices are used, yielding an integer value of two as the multiplier of the total number of bits, which is n=3 in this case.

In another embodiment the error correction coded data comprises one or more words, each the word comprising n bits, each word is produced from the convolution encoder in response to the convolution encoder processing a portion of the information. The portion of the information may comprise k bits. The distributor is further adapted to distribute each word to the plurality of storage devices such that none of the plurality of storage devices receives two or more consecutive words. FIG. 10 shows an example of error correction coded data distributed to storage devices (280), when a (2,1,3) binary convolution encoder (FIG. 4) is used to process the information to produce error correction coded data. Each word of the error correction coded data may comprise, for example two bits (n=2) as shown in FIG. 10, the first word comprises V(1,1) and V(1,2), the second word comprises V(2,1) and V(2,2), the third word comprises V(3,1) and V(3,2), etc. For this example, none of the of storage devices receives two or more consecutive words. For this embodiment, consecutive words comprises, for example, first word (V(1,1), V(1,2)) and second word (V(2,1), V(2,2)) or second word (V(2,1), V(2,2)) and third word (V(3,1) and V(3,2)). Examples of non consecutive words are: first word (V(1,1), V(1,2)) and third word (V(3,1) and V(3,2)) or second word (V(2,1), V(2,2)) and fourth word ((V(4,1), V(4,2)).

FIG. 10 also shows a table (290) of an example of error correction coded data as stored in a memory device, for example RAM 84. Table 290 is organized into columns, where each column comprises error correction coded data that is stored on a respective storage device. For example the first column of table 290 shows the error correction coded data for storage in drive 281. The length of the column may vary and in one embodiment the columns are allowed to fill to a specified capacity with error correction coded data before the error correction coded data is distributed and written to the respective storage devices. In step 725, the error correction coded data may be written to each respective storage device by, for example, write command 600 (FIG. 7).

In another embodiment a (3,2,1) binary convolution encoder is used to process the information and produce error correction coded data. FIG. 16 shows an example of error correction coded data distributed to storage devices, when a (3,2,1) binary convolution encoder (FIG. 14) is used to process the information to produce error correction coded data. Each word of the error correction coded data may comprise, for example three bits (n=3) as shown in FIG. 15, the first word comprises V(1,1), V(1,2) and V(1,3), the second word comprises V(2,1), V(2,2) and V(2,3), the third word comprises V(3,1), V(3,2) and V(3,3), etc. For this example, none of the storage devices receives two or more consecutive words.

From step 725, the process flows to step 730, where a metadata controller (i.e. metadata controller 98) processes the information to produce metadata (i.e. metadata 88, FIG. 8) associated with the error correction coded data. The metadata may comprise storage location information specifying a storage location for the error correction coded data and/or encoder information specifying the type of encoding for the coded data. For example, the type of encoding may include the specific convolution encoder used, the code parameters (i.e. (2,1,3) encoder in FIG. 4, (3,2,1) encoder of FIG. 15, etc.) The type of encoding may include other parameters associated with the encoder used. 'The storage location information specifying a storage location for the error correction coded data may comprise a storage device persistent name, a logical block address, a device number, a logical unit number, a volume serial number or other storage location identifiers. Processor 82 may be used to implement a metadata controller to perform the functions described above by for example, software, dedicated hardware, firmware or combinations thereof.

From step 730, the process flows to step 735, where a metadata controller (i.e. metadata controller 98) processes and stores the metadata on one or more of the storage devices or non-volatile memory (i.e. non-volatile memory 83). In certain embodiments, metadata 88 may be encoded by encoder 86 before storage. After execution of step 730 the process ends at step 740.

Figure 12:
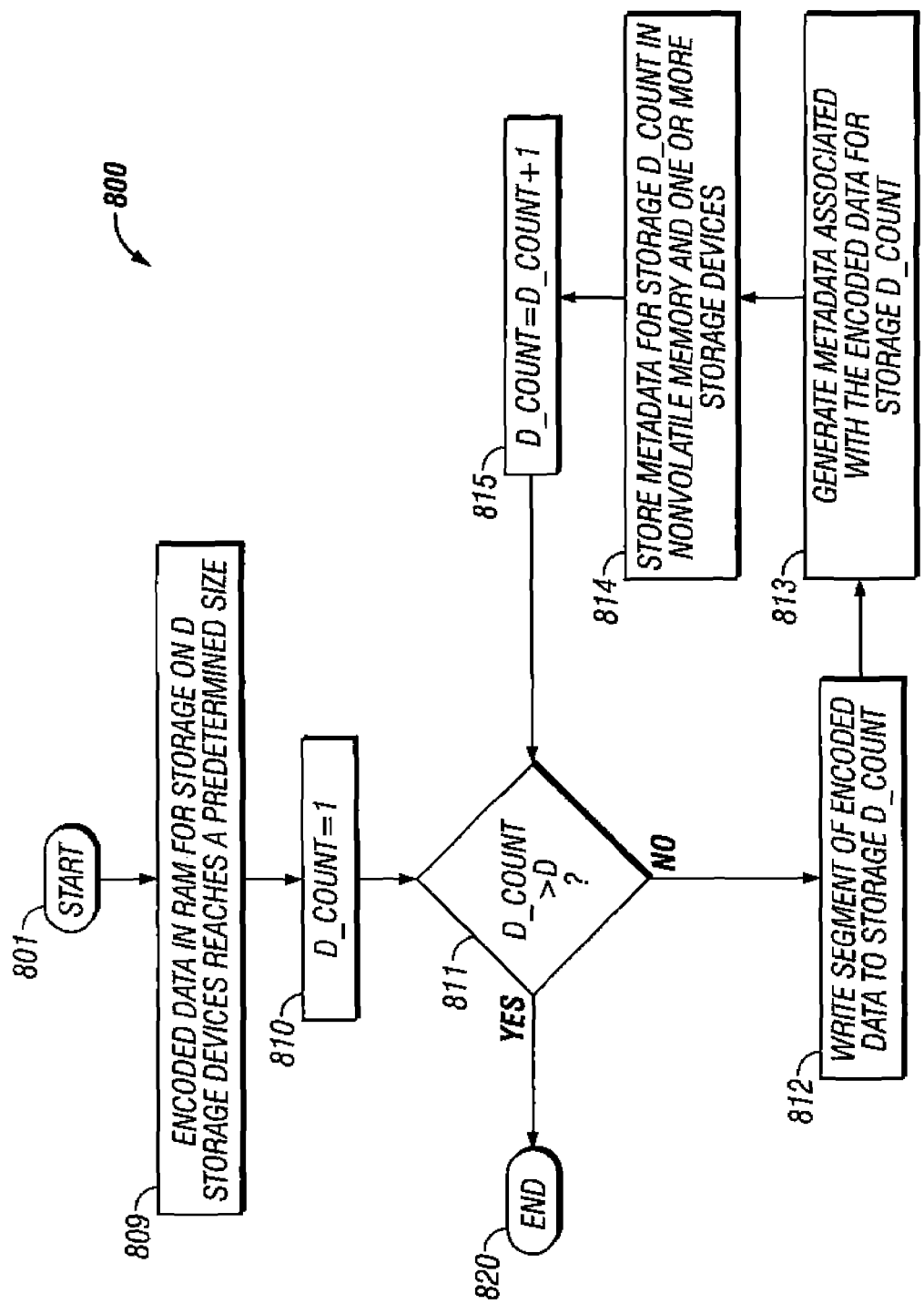
FIG. 12 illustrates a flowchart for the storage of error correction coded data and metadata on storage devices.

In certain embodiments the error correction coded data is stored on the storage devices by process 800 shown in FIG. 12. After the error correction coded data stored in RAM 84 teaches a predetermined size at step 809, the error correction coded data may be stored on the storage devices and the metadata may be stored in one or more devices (i.e. nonvolatile memory 83, RAM 84, host(s) 61-65, etc.). From step 809 the process flows to step 810, where index D_COUNT is initialized to 1. Then the process flows to decision step 811, where the determination is made whether D_COUNT exceeds the number of storage devices, D. If D_COUNT does not exceed the number of storage devices, D, the process flows to step 812, where the error correction coded data destined for storage device D_COUNT is written via a write command (i.e. write command 600) from RAM 84 to storage device D_COUNT. For example, in FIG. 9, the bits in column of Table 270 (i.e. bits V(1,1), V(4,1), etc.) are referred to as the error correction coded data segment written to storage 261. The process then flows to step 813, where metadata 88 is generated for the data stored in storage device D_COUNT. The process flows to step 814, where the metadata 88 generated in step 813 is stored for redundancy in nonvolatile memory 83 and one or more of the D storage devices. Then the process flows to step 815, where D_COUNT is increased by one. Then the process flows back to decision step 811 for another iteration. Once D_COUNT exceeds D in step 811, the process 800 ends in step 820.

Figure 13:
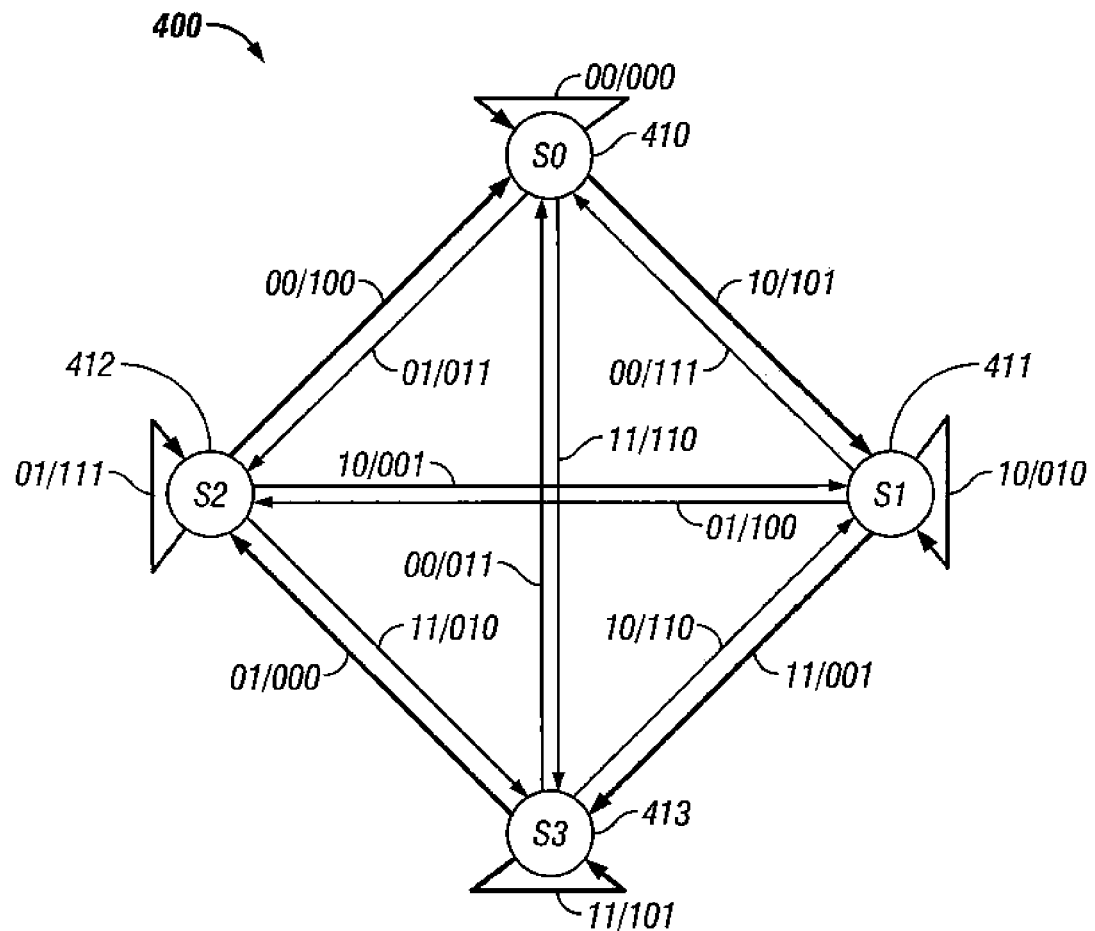
FIG. 13 illustrates an encoder state diagram for (3,2,1) code.

State diagram 200 of FIG. 2 is just one possible state diagram to use for convolution encoding. FIG. 13 illustrates state diagram 400 for (3,2,1) binary convolution encoding. State diagram 400 comprises four states; $S_0$ 410, $S_1$ 411, $S_2$ 412, and $S_3$ 413. Each transition between states in state diagram 400 results in the encoding of two bits of input information into three bits of error correction coded data. This encoding is best explained via table 590 in FIG. 14.

Analogous to table 290 in FIG. 3, table 590 in FIG. 14 has four columns, initial state 591, destination state 592, input information 593, and error correction coded data 594. There are a total of sixteen rows in table 590, based on a total of four states in state diagram 400 and four possible transitions from one specific state to the next immediately-possible states. Table 590 was generated via state diagram 400 and is used herein; to further illustrate the (3,2,1) encoding process.

In FIG. 13, highlighted encoding path $S_0$ 410, $S_1$ 411, $S_3$ 413, $S_3$ 413, $S_2$ 412, and $S_0$ 410 is shown for the example encoding of 1011110100. Starting from left to right for input 1011110100, $S_0$ 410 to $S_1$ 411 encodes 10 into 101. $S_1$ 411 to $S_3$ 413 encodes 11 into 001. $S_3$413 to $S_3$413 encodes 11 into 101. $S_3$ 413 to $S_2$ 412 encodes 01 in 000. Finally, $S_2$ 412 to $S_0$ 410 encodes 00 into 100. The result of this is that input information 1011110100 is encoded into 101001101000100 for distribution and storage across storage devices 91-93 in RAID 90.

In FIG. 15, encoder circuit 420 is shown for the binary (3,2,1) code of state diagram 400 of FIG. 13 and table 590 of FIG. 14. Encoder circuit 420 is another example of encoder 86 that may be implemented in device specific circuits 81 of controller 80. In certain embodiments only one type of encoder circuit 220 or 420 is employed in a single controller (i.e. controller 80). Encoder circuit 420 receives input information stream U 421 and breaks up the incoming bits via demultiplexer 422 into single bit streams U(J,1) 423 and U(J,2) 424, for encoding. Encoder circuit 420 comprises an m=1-stage shift register, comprising registers 430 and 431. The initial contents of registers 430-431 are typically initialized to zero for the encoding process. The input information streams U(J,1) 423 and U(J,2) 424 and the outputs of registers 430 and 431 are selectively added by n=3 modulo-2 adders; comprising adder 440 to produce output V(J,1) 441, adder 442 to produce output V(J,2) 443 and adder 444 to produce output V(J,3) 445. Multiplexer 451 serializes the individual encoder outputs V(J,1) 441, V(J,2) 443, and V(J,3) 445 into coded output V 450. Each incremental output of V 450 for an index of J, as defined by V(J,1) 441, V(J,2) 443, and V(J,3) 445 in FIG. 15, is referred to as a word.

FIG. 16 is analogous to FIG. 9, where the output of encoder circuit 420 is stored in 1-bit wide stripes across devices 461-466. Devices 461-466 are a plurality of storage devices such as storage devices 91-93 in FIG. 1. In FIG. 16, stripes 1-3 comprise a first portion of error correction coded data from a first input information and stripe 4 comprises a second portion of error correction coded data from a second input information. Stripe 1, is the first stripe in RAID 460, and is the first stripe of the first portion of error correction coded data. Stripe 1 comprises bit V(1,1) 471A in device 461, bit V(1,2) 471B in device 462, bit V(1,3) 471C in device 463, bit V(2,1) 471D in device 464, bit V(2,2) 471E in device 465 and bit V(2,3) 471F in device 466. Stripe 2 is the second stripe in RAID 460 of the same first portion of error correction coded data. Stripe 2 comprises bit V(3,1) 472A in device 461, bit V(3,2) 472B in device 462, bit V(3,3) 472C in device 463, bit V(4,1) 472D in device 464, bit V(4,2) 472E in device 465 and bit V(4,3) 472F in device 466. Stripe 3, is the third stripe in RAID 460 of the same first portion of error correction coded data. Stripe 3 comprises bit V(5,1) 473A in device 461, bit V(5,2) 473B in device 462, bit V(5,3) 473C in device 463, bit V(6,1) 473D in device 464, bit V(6,2) 473E in device 465 and bit V(6,3) 473F in device 466. Stripe 4, is the first stripe in RAID 460 of the second portion of error correction coded data. Stripe 4 comprises bit V(1,1) 474A in device 461, bit V(1,2) 474B in device 462, bit V(1,3) 474C in device 463, bit V(2,1) 474D in device 464, bit V(2,2) 474E in device 465 and bit V(2,3) 474F in device 466.

Figure 17:
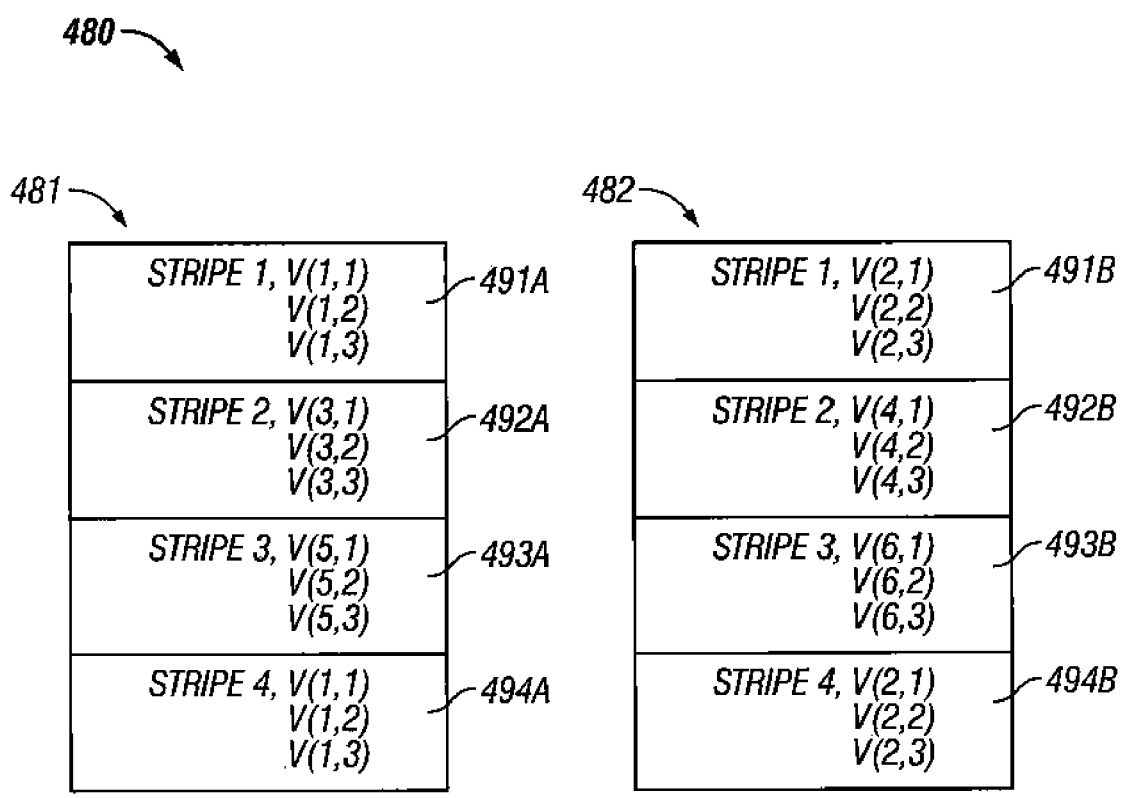
FIG. 17 illustrates a convolution RAID with k=3-bit wide stripes.

Similarly, FIG. 17 is analogous to FIG. 10, where the output of encoder circuit 420 is stored in n=3 bit wide stripes (where, n=3 bits comprise a "word") spread across devices 481-482. FIG. 17 shows an alternative to the 1 bit per stripe per device shown in FIG. 16. Because FIG. 15 has n=3 outputs, then n=3 bits of output V are stored per device in an n=3 bit wide stripe in FIG. 17. Three stripes of convolution-coded data of a first portion of error correction coded data from a first input information, and one stripe of a second portion of error correction coded data from a second input information are shown in FIG. 17 for RAID 480, which comprises devices 481-482. Devices 481-482 could be any pair of storage devices 91-93 of FIG. 1. Stripe 1, is the first stripe in RAID 480 and is the first stripe of the first portion of error correction coded data. Stripe 1 comprises bits V(1,1), V(1,2), V(1,3) 491A in device 481 and bits V(2,1), V(2,2), V(2,3) 491B in device 482. Similarly, stripe 2 is the second stripe in RAID 480 of the same first portion of error correction coded data. Stripe 2 comprises bits V(3,1), V(3,2), V(3,3) 492A in device 481 and bits V(4,1), V(4,2), V(4,3) 492B in device 482. Stripe 3 is the third stripe in RAID 480 of the same first portion of error correction coded data. Stripe 3 comprises bits V(5,1), V(5,2), V(5,3) 493A in device 481, and bits V(6,1), V(6,2), V(6,3) 493B in device 482. Stripe 4 is the fourth stripe in RAID 480, but it is the first stripe of the second portion of error correction coded data, therefore it comprises bits V(1,1), V(1,2), V(1,3) 494A in device 481 and bits V(2,1), V(2,2), V(2,3) 494B in device 482.

A few specific examples of convolution encoding and convolution are described herein. The examples are provided to describe convolution encoding to enable one skilled in the art to adapt any type of convolution encoding to the embodiments described, without limitation.

Another example of RAID expansion is shown with reference to FIGS. 16-17. RAID 480 of FIG. 17 can easily be expanded to RAID 460 of FIG. 16 by tripling the number of drives in the RAID and copying bits from the configuration in FIG. 17 into the configuration shown in FIG. 16. This RAID expansion adds free space to the RAID for further data addition and requires neither recalculation of parity as must be done for RAIDs 3, 4, 5, and 6, nor additional convolution encoding. Metadata 88 may need to be recalculated for all storage in the newly expanded RAID, as the starting LBAs and storage designators may change. In certain embodiments the storage devices (i.e. storage devices 91-93 in RAID 90) are disbursed to separate physical locations. For example, storage devices 91, 92 and 93 may each be physically separated from each other by locating storage devices 92-93 in different rooms, buildings, cities, states, countries, etc.

Certain embodiments, include charging a customer a fee for the storing the coded data, where the fee is based upon an amount of information received. This may be accomplished by, for example a customer agreement to send data to a service provider, where the service provider is responsible for storing and retrieving a customer's data, on demand. The service provider may be the manager of the storage system and/or a third party in a business relationship between the customer and another entity. The customer may be provided with a connection to a system for storing information (i.e. SAN 10, FIG. 1). The customer may send his information to the system for storage using the connection or other means. The amount or quantity of information sent by the customer or received by SAN 10 and/or controller 80 may be measured by methods known in the art for measuring the amount of data. The fee for storing a customer's information could be determined by considering the amount of information sent for storage and other factors such as: rate of information flow, frequency of use, compressed or non-compressed information, fixed monthly rate or other considerations.

The embodiments described herein may take the form of an entirely hardware embodiment, an entirely software embodiment or an embodiment containing both hardware and software elements. In certain embodiments, the invention is implemented in software, which includes but is not limited to firmware, resident software, microcode, etc.

Furthermore, embodiments described herein may take the form of a computer program product accessible from a computer-usable or computer-readable medium providing program code for use by or in connection with a computer or any instruction execution system. For the purposes of this description, a computer-usable or computer readable medium may be any apparatus that can contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk, read only memory (CD-ROM), compact disk, read/write (CD-R/W) and DVD.

A data processing system suitable for storing and/or executing program code may include at least one processor coupled directly or indirectly to memory elements through a system bus. The memory elements may include local memory employed during actual execution of the program code, bulk storage and cache memories which provide temporary storage of at least some program code in order to reduce the number of times code must be retrieved from bulk storage during execution.

Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The embodiments described herein may be implemented as a method, apparatus or computer program product using standard programming and/or engineering techniques to produce software, firmware, hardware, or any combination thereof.

In certain embodiments, Applicants' invention includes instructions, where those instructions are executed by processor 82 (FIG. 1) and/or controller 80 (FIG. 1) to perform steps recited in the flowcharts shown in FIGS. 11 and 12.

In other embodiments, Applicants' invention includes instructions residing in any other computer program product, where those instructions are executed by a computer external to or internal to, controller 80. In either case, the instructions may be encoded in an information storage medium comprising, for example, a magnetic information storage medium, an optical information storage medium, an electronic information storage medium, and the like. By "electronic storage media", Applicants mean, for example, a device such as a PROM, EPROM, EEPROM, Flash PROM, compact flash, smart media, and the like.

Certain embodiments may be directed toward a method for deploying computing infrastructure by a person or by an automated processing system, comprising integrating computer readable code into a system to perform the operations for the described embodiments. For example, FIGS. 11-12 illustrates steps for storing information in the form of coded data by use of the described embodiments. The code in combination with the system (i.e. SAN 10) is capable of performing the steps for the operation of the embodiments described herein. The deployment of the computing infrastructure may be performed during service, manufacture and/or configuration of the embodiments described herein. For example, a consulting business may have service responsibility for a number of systems. Such service responsibility may include such tasks as system upgrades, error diagnostic, performance tuning and enhancement, installation of new hardware, installation of new software, configuration with other systems, and the like. As part of this service, or as a separate service, the service personnel may configure the system according to the techniques described herein so as to efficiently enable operation of the embodiments described herein. For example, such a configuration could involve the loading into memory of computer instructions, parameters, constants (i.e. type of convolution encoding, number of bits, n in a word, stripe width, number of storage devices, etc.), interrupt vectors, so that when the code is executed, the system may carry out the techniques described to implement the embodiments described herein.

The foregoing description, for purposes of explanation, used specific nomenclature to provide a thorough understanding of the embodiments described. However, it will be apparent to one skilled in the art that the specific details are not required in order to practice the operation of the embodiments. In other instances, well known circuits and devices are shown in block diagram form in order to avoid unnecessary distraction from the embodiments. Thus, the foregoing descriptions of specific embodiments are presented for purposes of illustration and description. They are not intended to be exhaustive or to limit the operation of the embodiments to the precise forms disclosed. Obviously many modifications and variations are possible in view of the above teachings.

The logic of FIG. 11 and FIG. 12 describes specific operations occurring in a particular order. In alternative implementations, certain of the logic operations may be performed in a different order, modified or removed. Moreover, steps may be added to the above described logic and still conform to the described implementations. Further, operations described herein may occur sequentially or certain operations may be processed in parallel, or operations described as performed by a single process may be performed by distributed processes.

The logic of FIG. 11 and FIG. 12 may be implemented in software. This logic may be part of the operating system of a host system or an application program. In yet further implementations, this logic may be maintained in storage areas managed by SAN 10 or in a read only memory or other hardwired type of device. The preferred logic may be implemented in hard disk drives or in programmable and non-programmable gate array logic.

Those skilled in the art of RAID may develop other embodiments equivalent to the embodiments described herein. The terms and expressions which have been employed in the foregoing specification are used herein as terms of description and not of limitation, and there is no intention in the use of such terms and expressions of excluding equivalents of the features shown and described or portions thereof, it being recognized that the scope is defined and limited only by the claims which follow.

What is claimed is:

1. A system for storing information, comprising:
   a convolution encoder adapted to process said information by convolving present and past bits of said information to produce error correction coded data; and
   a distributor adapted to distribute said coded data to a plurality of storage devices such that one or more of said plurality of storage devices may fail while permitting said information to be reconstructed from said coded data stored on non-failing storage devices.

2. The system of claim 1, wherein said error correction coded data comprises one or more words, each said word comprising n bits, where n is greater than zero, each said word produced from said convolution encoder in response to said convolution encoder processing a portion of said information and said distributor is further adapted to distribute each said word to said plurality of storage devices such that none of said plurality of storage devices receives two or more consecutive words.

3. The system of claim 1, further comprising:
a metadata controller adapted to process said information to produce metadata associated with said coded data, said metadata comprising encoder information specifying the type of encoding for said coded data.

4. The system of claim 1, wherein said error correction coded data comprises one or more words, each said word comprising n bits, where n is greater than zero, each said word produced from said convolution encoder in response to said convolution encoder processing a portion of said information and said distributor is further adapted to distribute said n bits of each said word to said plurality of storage devices such that none of said plurality of storage devices receives more than one of said n bits of each said word.

5. The system of claim 4, wherein a total number of said plurality of storage devices is an integer multiple of said n bits.

6. The system of claim 1, further comprising:
a metadata controller adapted to process said information to produce metadata associated with said coded data, said metadata comprising storage location information specifying a storage location for said coded data.

7. The system of claim 6, wherein said metadata controller is further adapted to store said metadata on one or more of said plurality of storage devices.

8. The system of claim 6, wherein said metadata controller is further adapted to store said metadata on non-volatile memory.

9. A system for storing information, comprising:
a convolution encoder adapted to process said information to produce error correction coded data by convolving present and past bits of said information provided to said convolution encoder, wherein said error correction coded data comprises one or more words, each said word comprising n bits, where n is greater than zero, each said word produced from said convolution encoder in response to said convolution encoder processing a portion of said information;
a plurality of storage devices adapted for storing said coded data on said plurality of storage devices; and
a distributor adapted to distribute said coded data to said plurality of storage devices.

10. A distributor adapted to distribute error correction coded data generated by a convolution encoder to a plurality of storage devices such that one or more of said plurality of storage devices may fail while permitting said information to be reconstructed from said coded data stored on non-failing storage devices, said error correction coded data generated by convolving present and past bits of information provided to said convolution encoder.

11. The distributor of claim 10, wherein said error correction coded data comprises one or more words, each said word comprising n bits, where n is greater than zero, each said word produced from said convolution encoder in response to said convolution encoder processing a portion of said information and said distributor further adapted to distribute error correction coded data such that none of said plurality of storage devices receives more than one of said n bits of each said word.

12. The distributor of claim 10, wherein said error correction coded data comprises one or more words, each said word comprising n bits, where n is greater than zero, each said word produced from said convolution encoder in response to said convolution encoder processing a portion of said information and said distributor is further adapted to distribute each said word to said plurality of storage devices such that none of said plurality of storage devices receives two or more consecutive words.

13. A storage area network comprising:
at least one host computer;
a convolution encoder coupled to said at least one host computer and adapted to process information received from said at least one host computer to produce error correction coded data by convolving present and past bits of said information;
a plurality of storage devices adapted for storing said coded data on said plurality of storage devices; and
a distributor adapted to distribute said coded data to said plurality of storage devices such that one or more of said plurality of storage devices may fail while permitting said information to be reconstructed from said coded data stored on non-failing storage devices.

14. The storage area network of claim 13, wherein said error correction coded data comprises one or more words, each said word comprising n bits, where n is greater than zero, each said word produced from said convolution encoder in response to said convolution encoder processing a portion of said information and said distributor is further adapted to distribute each said word to said plurality of storage devices such that none of said plurality of storage devices receives two or more consecutive words.

15. The storage area network of claim 13, further comprising:
a metadata controller adapted to process said information to produce metadata associated with said coded data, said metadata comprising encoder information specifying the type of encoding for said coded data.

16. The storage area network of claim 13, wherein said plurality of storage devices are disbursed to separate physical locations.

17. The storage area network of claim 13, wherein said error correction coded data comprises one or more words, each said word comprising n bits, where n is greater than zero, each said word produced from said convolution encoder in response to said convolution encoder processing a portion of said information and said distributor is further adapted to distribute said n bits of each said word to said plurality of storage devices such that none of said plurality of storage devices receives more than one of said n bits of each said word.

18. The storage area network of claim 17, wherein a total number of said plurality of storage devices is an integer multiple of said n bits.

19. The storage area network of claim 13, further comprising:
a metadata controller adapted to process said information to produce metadata associated with said coded data, said metadata comprising storage location information specifying a storage location for said coded data.

20. The storage area network of claim 19, wherein said metadata controller is further adapted to store said metadata on one or more of said plurality of storage devices.

21. The storage area network of claim 19, wherein said metadata controller is further adapted to store said metadata on non-volatile memory.

22. A computer program product comprising a computer useable medium having a computer readable program embodied in said medium, wherein said computer readable program when executed on a computer causes said computer to:
receive information from a source;

process said information to produce error correction coded data by convolving present and past bits of said information received; and distribute said coded data to a plurality of storage devices such that one or more of said plurality of storage devices may fail while permitting said information to be reconstructed from said coded data stored on non-failing storage devices.

23. The computer program product of claim 22, wherein said error correction coded data comprises one or more words, each said word comprising n bits, where n is greater than zero, each said word produced in response to processing a portion of said information and said computer readable program when executed on said computer further causes said computer to:

distribute said n bits of each said word to said plurality of storage devices such that none of said plurality of storage devices receives more than one of said n bits of each said word.

24. The computer program product of claim 22, wherein said error correction coded data comprises one or more words, each said word comprising n bits, where n is greater than zero, each said word produced in response to processing a portion of said information and said computer readable program when executed on said computer further causes said computer to:

distribute each said word to said plurality of storage devices such that none of said plurality of storage devices receives two or more consecutive words.

25. The computer program product of claim 22, wherein said computer readable program when executed on said computer further causes said computer to:

produce metadata associated with said coded data, said metadata comprising storage location information specifying a storage location for said coded data.

26. The computer program product of claim 25, wherein said computer readable program when executed on said computer further causes said computer to:

store said metadata on one or more of said plurality of storage devices.

27. The computer program product of claim 22, wherein said computer readable program when executed on said computer further causes said computer to:

produce metadata associated with said coded data, said metadata comprising encoder information specifying the type of encoding for said coded data.

* * * * *